(12) United States Patent
Ninomiya et al.

(10) Patent No.: US 11,283,415 B2
(45) Date of Patent: Mar. 22, 2022

(54) HIGH-FREQUENCY AMPLIFIER

(71) Applicant: MITSUBISHI ELECTRIC CORPORATION, Tokyo (JP)

(72) Inventors: Dai Ninomiya, Tokyo (JP); Eigo Kuwata, Tokyo (JP); Kazuhiko Nakahara, Tokyo (JP); Makoto Kimura, Tokyo (JP); Yoshitaka Kamo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 191 days.

(21) Appl. No.: 16/625,369

(22) PCT Filed: Jul. 14, 2017

(86) PCT No.: PCT/JP2017/025752
§ 371 (c)(1),
(2) Date: Dec. 20, 2019

(87) PCT Pub. No.: WO2019/012691
PCT Pub. Date: Jan. 17, 2019

(65) Prior Publication Data
US 2021/0328557 A1 Oct. 21, 2021

(51) Int. Cl.
*H03F 3/191* (2006.01)
*H03F 1/56* (2006.01)
*H03F 3/19* (2006.01)

(52) U.S. Cl.
CPC ............. *H03F 1/56* (2013.01); *H03F 3/19* (2013.01); *H03F 2200/222* (2013.01); *H03F 2200/387* (2013.01)

(58) Field of Classification Search
CPC ........................................................ H03F 3/191
USPC ................................................. 330/302, 305
See application file for complete search history.

(56) References Cited

U.S. PATENT DOCUMENTS

| | | | | |
|---|---|---|---|---|
| 7,084,708 B2 * | 8/2006 | Sugiura | ............. | H01L 23/49838 330/302 |
| 7,439,802 B2 * | 10/2008 | Tsai | ............. | H03F 1/26 330/109 |
| 8,279,013 B2 * | 10/2012 | Tsukahara | ............. | H03F 3/601 330/302 |

FOREIGN PATENT DOCUMENTS

| | | |
|---|---|---|
| JP | 2008-113402 A | 5/2008 |
| JP | 2013-118329 A | 6/2013 |

OTHER PUBLICATIONS

Extended European Search Report issued in corresponding European Application No. 17 917 887.6 dated Jun. 9, 2020.

(Continued)

*Primary Examiner* — Henry Choe
(74) *Attorney, Agent, or Firm* — Birch, Stewart, Kolasch & Birch, LLP

(57) ABSTRACT

A MIM capacitor is included in any one or more of a first matching circuit and a second matching circuit. The mat capacitor performs impedance matching of a fundamental wave included in a high-frequency signal with a transmission line, and forms a short-circuit point for a harmonic included in the high-frequency signal at a connection point with the transmission line.

18 Claims, 14 Drawing Sheets

(56) References Cited

OTHER PUBLICATIONS

Nemati et al., "Design of High Efficiency Ka-Band Harmonically Tuned Power Amplifiers", IEEE 2009, Microwave Electronics Laboratory, Department of Micsotechnology and Nanoscience Chalmers University of Technology, 412 96 Gothenburg, Sweden, pp. 264-267.

Yu et al., "C-band 60W GaN power amplifier MMIC desiqned with harmonic tuned approach", IEEE Electronics Letters, 2016, vol. 52, No. 3. pp. 219-221.

* cited by examiner

λ: Wavelength of High-frequency Wave

Open Stub having Length of Quarter Wavelength at Normalized Frequency of 1

HIGH-FREQUENCY AMPLIFIER

TECHNICAL FIELD

The present invention relates to a high-frequency amplifier that amplifies a high-frequency signal.

BACKGROUND ART

A high-frequency amplifier that amplifies a high-frequency signal may perform harmonic processing in order to implement a highly efficient operation.

For example, a high-frequency amplifier that performs harmonic processing by connecting an open stub having a length that is a quarter of a wavelength of a harmonic included in a high-frequency signal to a transmission line of the high-frequency signal is known.

However, in order to perform the harmonic processing over a wide band, it is necessary to increase a line width of the open stub. For this reason, a circuit size increases with increase in bandwidth of the harmonic processing.

Non-Patent Literature 1 below discloses a high-frequency amplifier that performs harmonic processing using a resonance circuit and without using an open stub which leads to an increase in circuit size.

This resonance circuit includes a metal insulator metal (MIM) capacitor, and the MIM capacitor and an inductance component of a transmission line resonate at a harmonic frequency.

CITATION LIST

Non-Patent Literatures

Non-Patent Literature 1: Xuming Yu et al., "C-band 60 W GaN power amplifier MMIC designed with harmonic tuned approach", 2016. IEEE ELECTRONICS LETTERS

SUMMARY OF INVENTION

Technical Problem

The high-frequency amplifier disclosed in Non-Patent Literature 1 can reduce the size of a circuit required for performing the harmonic processing, compared to a high-frequency amplifier using an open stub. However, it is necessary to provide a matching circuit that achieves impedance matching of a fundamental wave included in a high-frequency signal, separately from the resonance circuit that performs the harmonic processing. For this reason, there is a problem that it is necessary to ensure an area where both the resonance circuit and the matching circuit are mounted.

The present invention has been made to solve the above problem, and an object of the present invention is to obtain a high-frequency amplifier capable of being reduced in circuit size as compared with a case where a resonance circuit and a matching circuit are separately mounted.

Solution to Problem

An amplifier according to the present invention includes: a transistor for amplifying a high-frequency signal; a first matching circuit connected to an input side of the transistor; a second matching circuit connected to an output side of the transistor; and a metal insulator metal (MIM) capacitor having one end connected to a transmission line for the high-frequency signal extending from an input side of the first matching circuit to an output side of the second matching circuit, the MIM capacitor having another end grounded, in which the MIM capacitor is included in any one or more of the first matching circuit and the second matching circuit, and the MIM capacitor achieves impedance matching of a fundamental wave included in the high-frequency signal with the transmission line, and forms a short-circuit point for a harmonic included in the high-frequency signal at a connection point with the transmission line.

Advantageous Effects of Invention

According to the present invention, since the MIM capacitor is included in any one or more of the first matching circuit and the second matching circuit, and the MIM capacitor achieves impedance matching of the fundamental wave included in the high-frequency signal with the transmission line, and forms the short-circuit point for the harmonic included in the high-frequency signal at the connection point with the transmission line. Accordingly, there is an effect that its circuit size can be reduced as compared with a case where a resonance circuit and a matching circuit are separately mounted.

DESCRIPTION OF EMBODIMENTS

Hereinafter, in order to explain the present invention in more detail, embodiments for carrying out the present invention will be described with reference to the accompanying drawings.

First Embodiment

Figure 1:
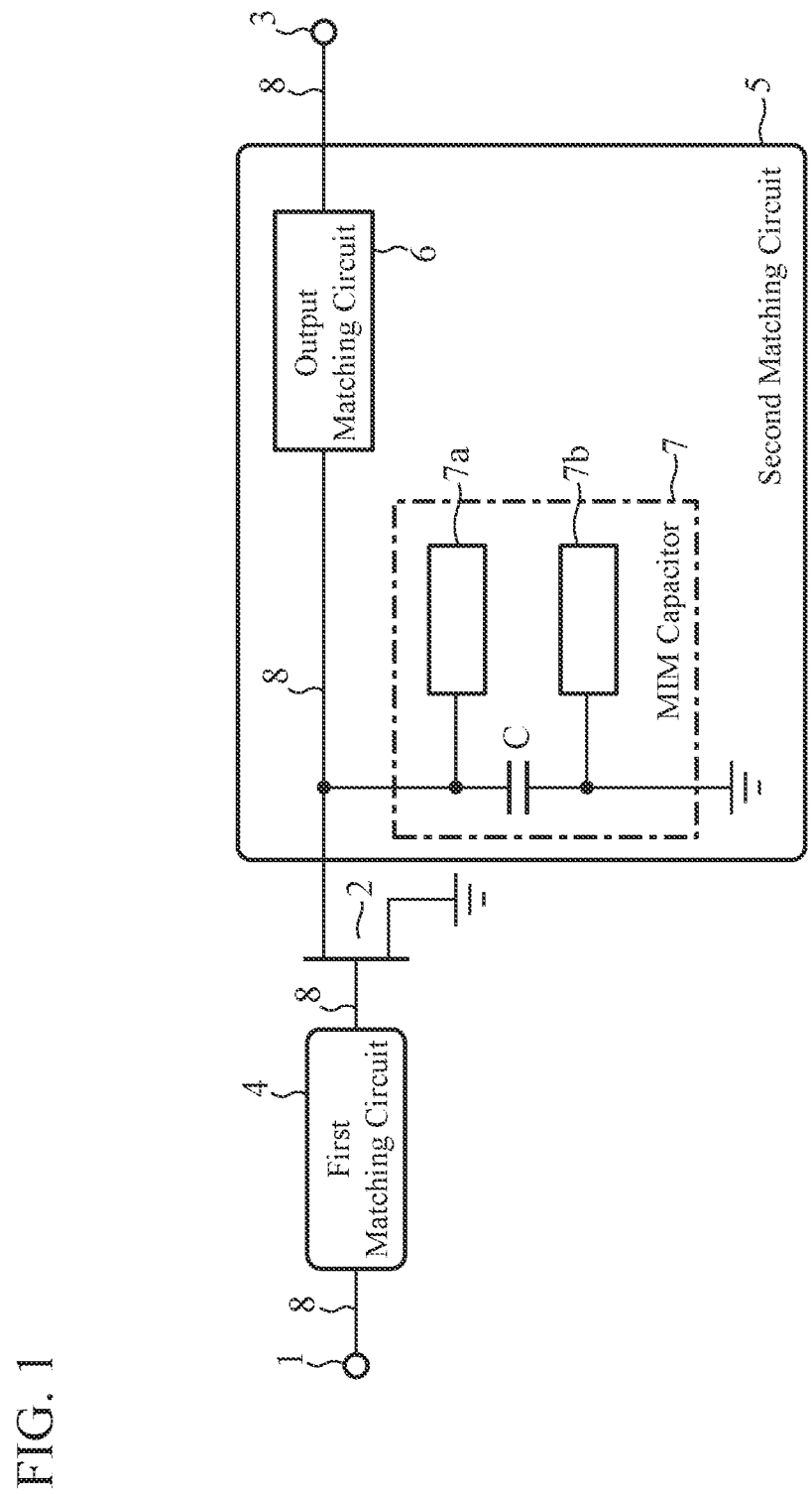
FIG. 1 is a configuration diagram showing a high-frequency amplifier according to a first embodiment of the present invention.

FIG. 1 is a configuration diagram showing a high-frequency amplifier according to a first embodiment of the present invention.

In FIG. 1, an input terminal 1 is a terminal for inputting a high-frequency signal.

A transistor 2 is a high-frequency transistor that amplifies a high-frequency signal input from the input terminal 1 and passed through a first matching circuit 4, and outputs the amplified high-frequency signal to a second matching circuit 5.

The first matching circuit 4 has one end connected to the input terminal 1 and another end connected to an input side of the transistor 2.

The first matching circuit 4 is an input matching circuit that performs impedance matching, between an output impedance of a signal source of a high-frequency signal connected to the input terminal 1 and an input impedance of the transistor 2, of a fundamental wave included in the high-frequency signal.

Although FIG. 1 shows an example in which the first matching circuit 4 is connected to the input side of the transistor 2, an interstage matching circuit may be connected to the input side of the transistor 2.

An output terminal 3 is a terminal that outputs a high-frequency signal amplified by the transistor 2 and then passed through the second matching circuit 5.

The second matching circuit 5 has one end connected to an output side of the transistor 2 and another end connected to the output terminal 3, and includes an output matching circuit 6 and a metal insulator metal (MIM) capacitor 7.

The output matching circuit 6 is a fundamental wave matching circuit that performs impedance matching, between an output impedance of the transistor 2 and an impedance of a load connected to the output terminal 3, of the fundamental wave included in the high-frequency signal.

As a general fundamental wave matching circuit, for example, a configuration including an inductor connected in series with a transmission line and a capacitor connected in parallel with the transmission line can be considered. However, since one end of the MIM capacitor 7 is connected to a transmission line 8, the output matching circuit 6 does not have to include the capacitor connected in parallel with the transmission line.

In other words, the MIM capacitor 7 constitutes a part of the fundamental wave matching circuit, and a set of the output matching circuit 6 and the MIM capacitor 7 functions as a so-called fundamental wave matching circuit.

Therefore, the output matching circuit 6 is smaller in circuit size than the general fundamental wave matching circuit.

Although FIG. 1 shows an example in which the output matching circuit 6 is connected to the output side of the transistor 2, an interstage matching circuit may be connected to the output side of the transistor 2.

The MIM capacitor 7 is included in the second matching circuit 5.

The MIM capacitor 7 includes an upper electrode 7a and a lower electrode 7b, one end of which is connected to the transmission line 8 of the high-frequency signal extending from an input side of the first matching circuit. 4 to an output side of the output matching circuit 6, and another end of which is grounded.

The MIM capacitor 7 achieves impedance matching of the fundamental wave included in the high-frequency signal with the transmission line 8, and acts to form a short-circuit point for a harmonic included in the high-frequency signal at a connection point with the transmission line 8.

In the first embodiment, the harmonic included in the high-frequency signal is assumed to be a second-order harmonic, but may be equal to or higher than a third-order harmonic.

FIG. 1 shows an example in which the MIM capacitor 7 is included in the second matching circuit 5, but the present invention is not limited to this.

Figure 2:
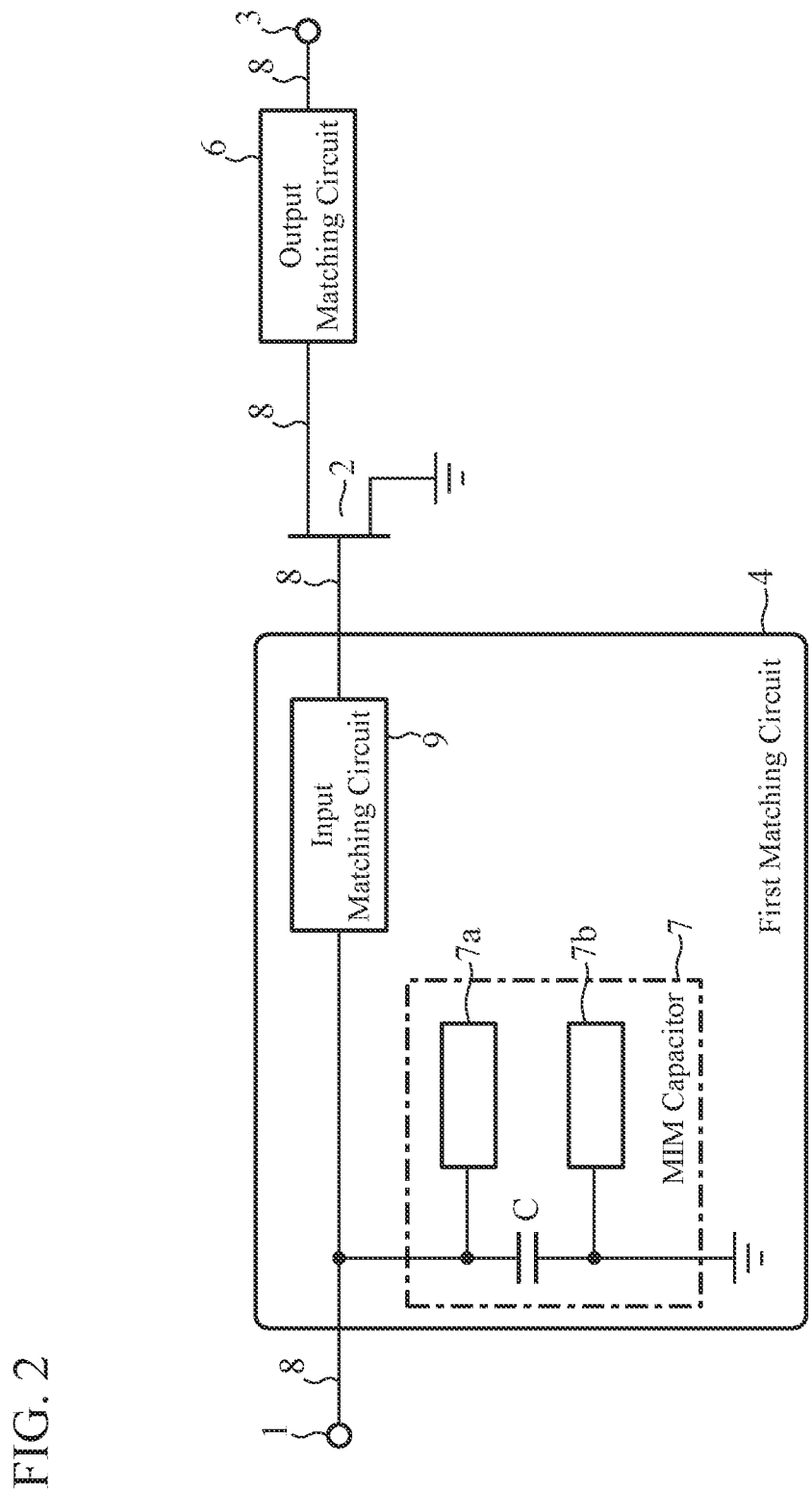
FIG. 2 is a configuration diagram showing another high-frequency amplifier according to the first embodiment of the present invention.

For example, as shown in FIG. 2, the MIM capacitor 7 may be included in a first matching circuit 4.

FIG. 2 is a configuration diagram showing another high-frequency amplifier according to the first embodiment of the present invention.

Even when the MIM capacitor 7 is included in the first matching circuit 4, impedance matching of the fundamental wave included in the high-frequency signal is achieved with the transmission line 8, and a short-circuit point for the harmonic included in the high-frequency signal is formed at a connection point with the transmission line 8.

Ira FIG. 2, an input matching circuit 9 is a fundamental wave matching circuit that performs impedance matching, between the output impedance of the signal source of the high-frequency signal connected to the input terminal 1 and the input impedance of the transistor 2, of the fundamental wave included in the high-frequency signal.

In a case of FIG. 2, because one end of the MIM capacitor 7 is connected to the transmission line 8, the input matching circuit 9 does not need to include a capacitor connected in parallel to the transmission line.

In other words, the MIM capacitor 7 constitutes a part of the fundamental wave matching circuit, and a set of the input matching circuit 9 and the MIM capacitor 7 functions as a so-called fundamental wave matching circuit.

Therefore, the input matching circuit 9 is smaller in circuit size than the general fundamental wave matching circuit.

Figure 3:
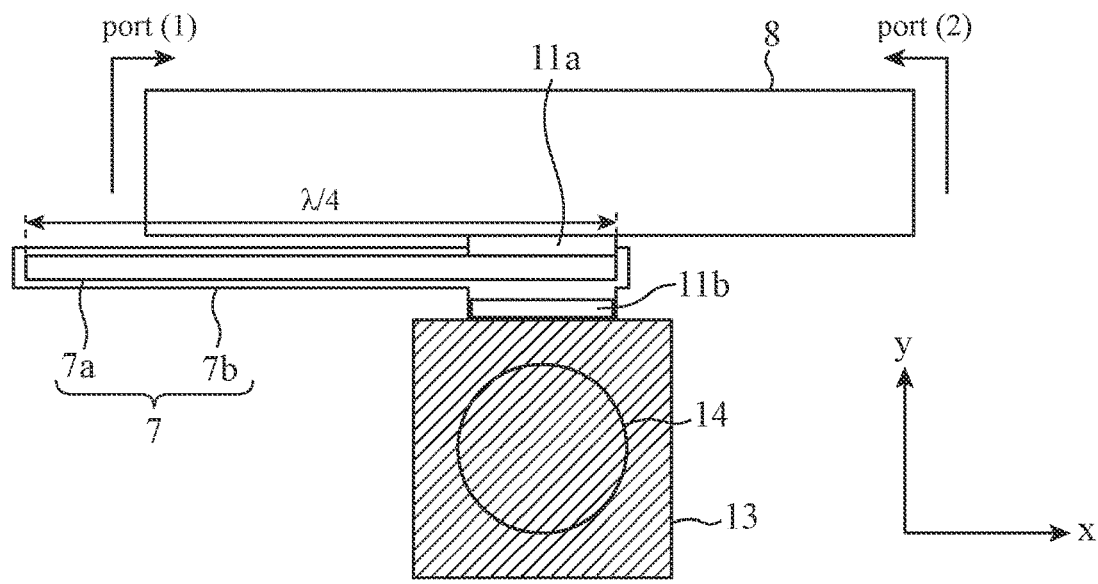
FIG. 3 is a configuration diagram showing a MIM capacitor 7 of the high-frequency amplifier according to the first embodiment of the present invention.

FIG. 3 is a configuration diagram showing the MIM capacitor 7 of the high-frequency amplifier according to the first embodiment of the present invention.

Figure 4:
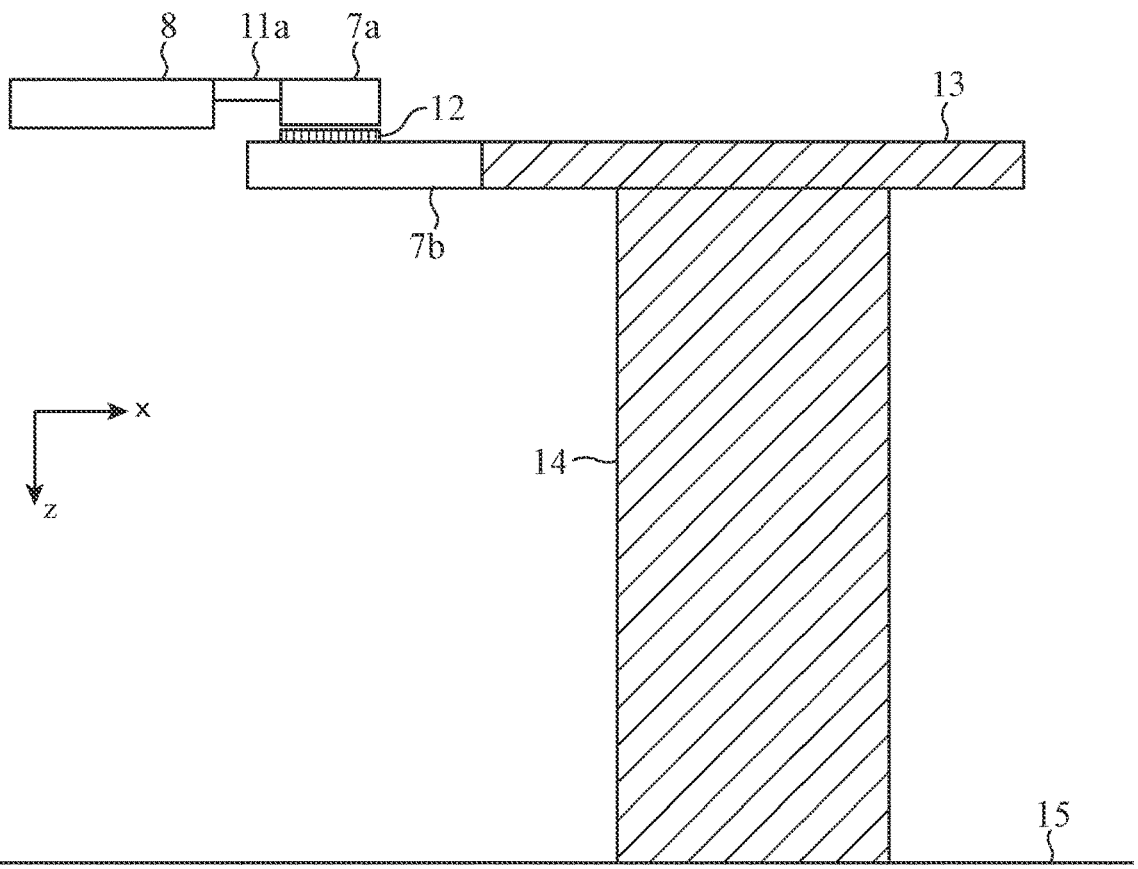
FIG. 4 is a cross-sectional view showing the MIM capacitor 7 of the high-frequency amplifier according to the first embodiment of the present invention.

FIG. 4 is a cross-sectional view showing the MIM capacitor 7 of the high-frequency amplifier according to the first embodiment of the present invention.

In FIGS. 3 and 4, a port (1) is connected to the output side of the transistor 2, and a port (2) is connected to the second matching circuit 5.

The upper electrode 7a is one electrode of the MIM capacitor 7, and one end thereof is connected to the transmission line 8 through an air bridge 11a.

A length of the upper electrode 7a is a quarter of a wavelength of the harmonic contained in the high-frequency signal.

The lower electrode 7b is an electrode facing the upper electrode 7a, and a dielectric layer 12 is inserted between the upper electrode 7a and the lower electrode 7b.

The air bridge 11a is a connection member that electrically connects the upper electrode 7a and the transmission line 8.

An air bridge 11b is a connection member that electrically connects the lower electrode 7b and a conductor plate 13.

The conductor plate 13 is electrically connected to the lower electrode 7b through the air bridge 11b.

A source via 14 has one end electrically connected to the conductor plate 13 and another end connected to a ground 15, and grounds the lower electrode 7b of the MIM capacitor 7.

Next, operation will be described.

When a high-frequency signal is input from the input terminal 1, a fundamental wave included in the high-frequency signal passes through the first matching circuit 4 and reaches the input side of the transistor 2.

In other words, since the first matching circuit 4 performs impedance matching of the fundamental wave, the fundamental wave passes through the first matching circuit 4.

Since the first matching circuit 4 does not perform impedance matching of a harmonic included in the high-frequency signal, a part of the harmonic does not pass through the first matching circuit 4, but there is also a high frequency that reaches the input side of the transistor 2.

The transistor 2 amplifies the high-frequency signal that has passed through the first matching circuit 4, and outputs the amplified high-frequency signal to the second matching circuit 5.

The fundamental wave included in the high-frequency signal amplified by the transistor 2 passes through the output matching circuit 6 in the second matching circuit 5 and is output from the output terminal 3 to an external load.

In other words, since the output matching circuit 6 in the second matching circuit 5 performs impedance matching of the fundamental wave, the fundamental wave passes through the output matching circuit 6.

Since the output matching circuit 6 in the second matching circuit 5 does not perform impedance matching of the harmonic, a part of the high-frequency does not pass through the output matching circuit 6, but there is also a high frequency that reaches the output terminal 3.

However, the MIM capacitor 7 acts to achieve impedance matching of the fundamental wave with the transmission line 8. Further, the MIM capacitor 7 acts to form a short-circuit point for the harmonic at the connection point with the transmission line 8. For this reason, reduction of the fundamental wave reaching the output terminal 3 can be suppressed. Further, since the high frequency output from the transistor 2 is reflected at the short-circuit point and returns to the transistor 2, efficiency of the transistor 2 is improved.

Here, the MIM capacitor 7 will be specifically described.

Each shape of the upper electrode 7a and the lower electrode 7b in the MIM capacitor 7 is a rectangle that is long in an x-axis direction, as shown in FIG. 3.

A length of the upper electrode 7a in the x-axis direction is a quarter of a wavelength of the harmonic.

A length of the lower electrode 7b in the x-axis direction is the same as the length of the upper electrode 7a or longer than that of the upper electrode 7a.

In an example of FIGS. 3 and 4, the length of the lower electrode 7b in the x-axis direction is longer than that of the upper electrode 7a.

The MIM capacitor 7 has a capacitance value "C" that is directly proportional to a total area of the upper electrode 7a, and this capacitance value "C" acts as a parallel capacitor inside the second matching circuit 5.

The transmission line 8 has an inductance component and a capacitance component with respect to the high-frequency signal.

The fundamental wave is matched between the MIM capacitor 7 and the transmission line 8 by a combination of the capacitance value "C" of the MIM capacitor 7, the inductance component of the transmission line 8, and the capacitance component of the transmission line 8.

Since the upper electrode 7a of the MIM capacitor 7 has a length that is a quarter of the wavelength of the harmonic, a short-circuit point for a harmonic is formed at the air bridge 11a that is a connection point between the transmission line 8 and the upper electrode 7a. This action is similar to an action of an open stub having a length that is a quarter of the wavelength of the harmonic.

Therefore, the MIM capacitor 7 acts to achieve a fundamental wave matching effect by the combination with the transmission line 8 and a harmonic processing effect by forming the short-circuit point for the harmonic.

The fundamental wave matching effect depends on the capacitance value "C" of the MIM capacitor 7.

The capacitance value "C" of the MIM capacitor 7 is a lumped constant effect that depends on the area of the upper electrode 7a, and does not depend on the shape of the upper electrode 7a.

The upper electrode 7a of the MIM capacitor 7 only needs to have a length that is a quarter of the wavelength of the harmonic in order to achieve the harmonic processing effect, and the area of the upper electrode 7a may be the same as an area of the MIM capacitor that achieves only the fundamental wave matching effect. Therefore, both the fundamental wave matching effect and the harmonic processing effect can be obtained without increasing the area.

Hereinafter, effects of the high-frequency amplifier according to the first embodiment will be described.

Here, for convenience of explanation, it is assumed that a substrate corresponding to a length of the source via 14 is a GaAs substrate having a thickness of 100 μm, thickness of the dielectric layer 12 is 1 μm, a relative dielectric constant of the dielectric layer 12 is 6, and the capacitance value "C" of the MIM capacitor 7 is 0.63 pF.

In addition, an electrical length of the upper electrode 7a of the MIM capacitor 7 connected to the transmission line 8, which is a main line, is a quarter wavelength at a frequency of 18.5 GHz.

In a high-frequency amplifier using an open stub (hereinafter referred to as a conventional high-frequency amplifier), it is assumed that a capacitance value of a capacitor connected to a main line is 0.63 pF, an electrical length of the open stub connected to the main line is a quarter wavelength at a frequency of 18.5 GHz, and a width of the open stub is 10 μm.

Figure 5:
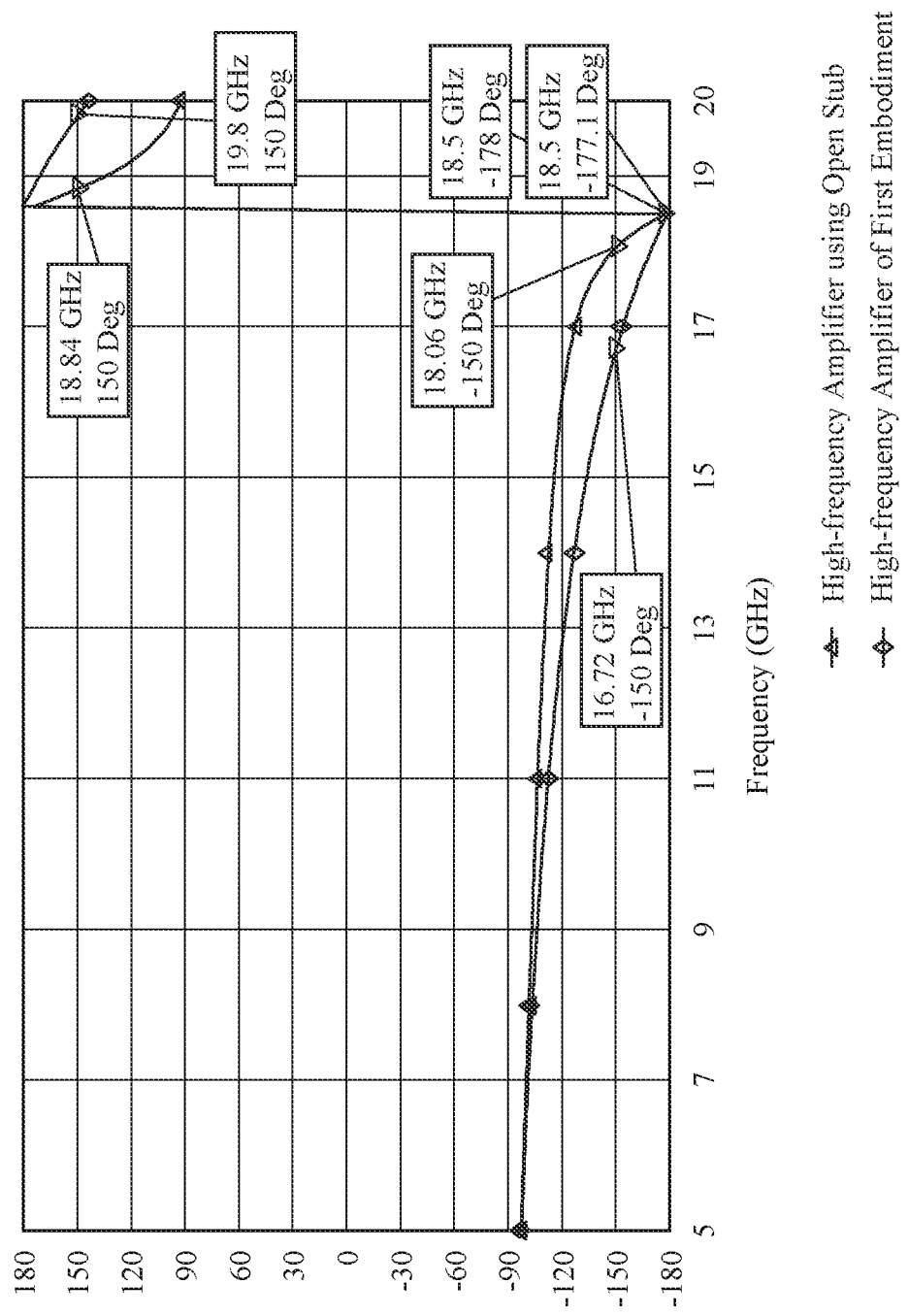
FIG. 5 is an explanatory diagram showing calculation results of frequency characteristics of reflection phases viewed from a main line.

FIG. 5 is an explanatory diagram showing calculation results of frequency characteristics of reflection phases viewed from the main line.

From the calculation results of the frequency characteristics shown in FIG. 5, it can be seen that both the high-frequency amplifier of the first embodiment and the conventional high-frequency amplifier have a short-circuit impedance at the frequency of 18.5 GHz.

For this reason, the high-frequency amplifier of the first embodiment and the conventional high-frequency amplifier can create the same impedance condition.

For example, in the GaAs substrate having the thickness of 100 μm, a physical length of a 10 μm wide open stub with an electrical length being a quarter wavelength at a frequency of 18.5 GHz is 1.5 mm. In the high-frequency amplifier according to the first embodiment, an open stub having an area of 10 μm×1.5 mm is unnecessary, and therefore its area can be reduced as compared with that of the conventional high-frequency amplifier using the open stub.

Note that, in a conventional multi-cell or multi-stage high-frequency amplifier, since a large number of open stubs need to be disposed, a difference between the area of the high-frequency amplifier of the first embodiment and an area of the conventional high-frequency amplifier becomes large.

From the frequency characteristics of a phase angle near the frequency of 18.5 GHz shown in FIG. 5, for example, when a frequency range in a phase range in which the phase angle is 180 degrees±30 degrees is calculated, in the conventional high-frequency amplifier, the frequency range is 18.06 to 18.84 GHz, and a bandwidth is about 0.8 GHz.

In the high-frequency amplifier of the first embodiment, the frequency range is 16.72 to 19.8 GHz, and the bandwidth is about 3.1 GHz.

Therefore, the high-frequency amplifier according to the first embodiment can expand the bandwidth nearly four times as compared with the conventional high-frequency amplifier.

This difference in bandwidth is caused by a difference in characteristic impedance of the open stub, and it is known that the open stub can form a broadband short-circuit point as the impedance is lower.

Figure 6:
FIG. 6 is an explanatory diagram showing an example of an open stub having a characteristic impedance of Zco and a length of a quarter wavelength at a normalized frequency of 1.

FIG. 6 is an explanatory diagram showing an example of an open stub having a characteristic impedance of Zco and a length of a quarter wavelength at a normalized frequency of 1. In FIG. 6, $\Gamma_0$ is a reflection phase when the open stub is seen from a connection point with the transistor 2.

Figure 7:
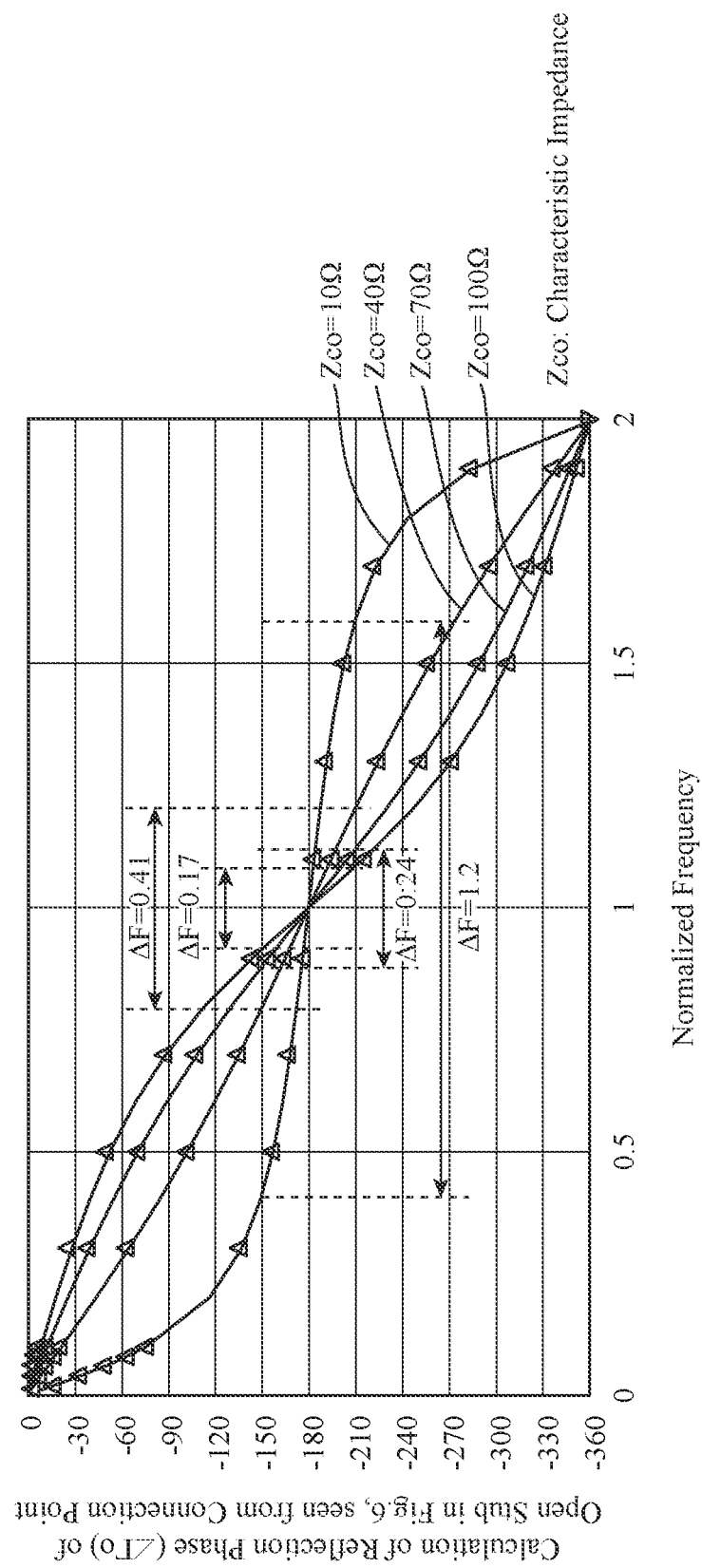
FIG. 7 is an explanatory diagram showing calculation results of normalized frequency dependence of a reflection phase $\Gamma_0$ when the characteristic impedance Zco is 10Ω, 40Ω, 70Ω, and 100Ω.

FIG. 7 is an explanatory diagram showing calculation results of normalized frequency dependence of the reflection phase $\Gamma_0$ when the characteristic impedance Zco is 10Ω, 40Ω, 70Ω, and 100Ω.

In FIG. 7, the reflection phase $\Gamma_0$=−180 is a short-circuit point, and complex impedance is 0Ω.

When the normalized frequency changes from 1, the reflection phase $\Gamma_0$ changes. A range in which this reflection phase $\Gamma_0$ is close to the short-circuit point varies depending on the characteristic impedance Zco.

For example, when a desired reflection phase range is −180±30, a normalized frequency range ΔF when Zco=10Ω is 1.2, and the normalized frequency range ΔF when Zco=40Ω is 0.41.

Further, the normalized frequency range ΔF when Zco=70Ω is 0.24, and the normalized frequency range ΔF when Zco=100Ω is 0.17.

From the above, it is found that by reducing the characteristic impedance Zco of the open stub, a frequency band that becomes impedance near the short-circuit point can be widened.

In the high-frequency amplifier according to the first embodiment, since the lower electrode 7b is connected to the ground 15 through the air bridge 11b, the conductor plate 13, and the source via 14, potential of the lower electrode 7b is the same as ground potential. For this reason, ground capacitance of the lower electrode 7b increases, and the characteristic impedance of the open stub formed by the upper electrode 7a decreases.

Further, the thickness of the dielectric layer 12 between the upper electrode 7a and the lower electrode 7b is generally extremely thin compared to the thickness of the substrate corresponding to the length of the source via 14 from the viewpoint of constituting a capacitor.

By forming the dielectric layer 12 to be thin, a gap between the upper electrode 7a and the lower electrode 7b is narrowed, so that the characteristic impedance is lowered.

The high-frequency amplifier according to the first embodiment has a lower open stub characteristic impedance than the conventional high-frequency amplifier, and thus can form a broadband short-circuit point.

In the high-frequency amplifier of FIG. 1, an example in which the short-circuit point is configured on the output side of the transistor 2 is shown. When the short-circuit point is configured on a second-order harmonic frequency, a class "F" amplifier is formed, and when the short-circuit point is configured on a third-order harmonic frequency, an inverse class "F" amplifier is formed.

The class "F" amplifier, the inverse class "F" amplifier, and the like are high-efficiency operation-class high-frequency amplifiers and can achieve a wide band.

As is apparent from the above, according to the first embodiment, the MIM capacitor 7 is included in any one or more of the first matching circuit 4 and the second matching circuit 5, and the MIM capacitor 7 performs the impedance matching of the fundamental wave included in the high-frequency signal with the transmission line 8, and forms the short-circuit point for the harmonic included in the high-frequency signal at the connection point with the transmission line 8. Therefore, its circuit size can be reduced as compared with a case where a resonance circuit and a matching circuit are separately mounted.

In the first embodiment, the MIM capacitor 7 forms the short-circuit point for the harmonic at the connection point with the transmission line 8, but in the high-frequency amplifier, the short-circuit point is not only used for reflecting the harmonic, but also used for suppressing leakage of high-frequency power. In other words, the MIM capacitor 7 can also be used as a filter that suppresses the leakage of the high-frequency power. For example, leakage of high-frequency power to adjacent channels can be suppressed during communication.

In the first embodiment, an example in which a longitudinal direction of the upper electrode 7a provided in the MIM capacitor 7 is disposed in the x-axis direction is shown, but the upper electrode 7a is not limited to one extending in a straight line. Instead, for example, it may be bent into an L shape in the middle, or may be bent into a U shape.

Further, the shape of the upper electrode 7a may be an arbitrary shape such as an elliptical shape.

An example in which the upper electrode 7a is connected to the transmission line 8 through the air bridge 11a and the lower electrode 7b is connected to the ground 15 through the air bridge 11b, the conductor plate 13, and the source via 14, is shown in the first embodiment.

No limitation is intended. For example, as shown in FIG. 8, a lower electrode 7b may be connected to the transmission line 8 through an air bridge 11a, and an upper electrode 7a may be connected to a ground 15 through an air bridge 11b, a conductor plate 13, and a source via 14.

Figure 8:
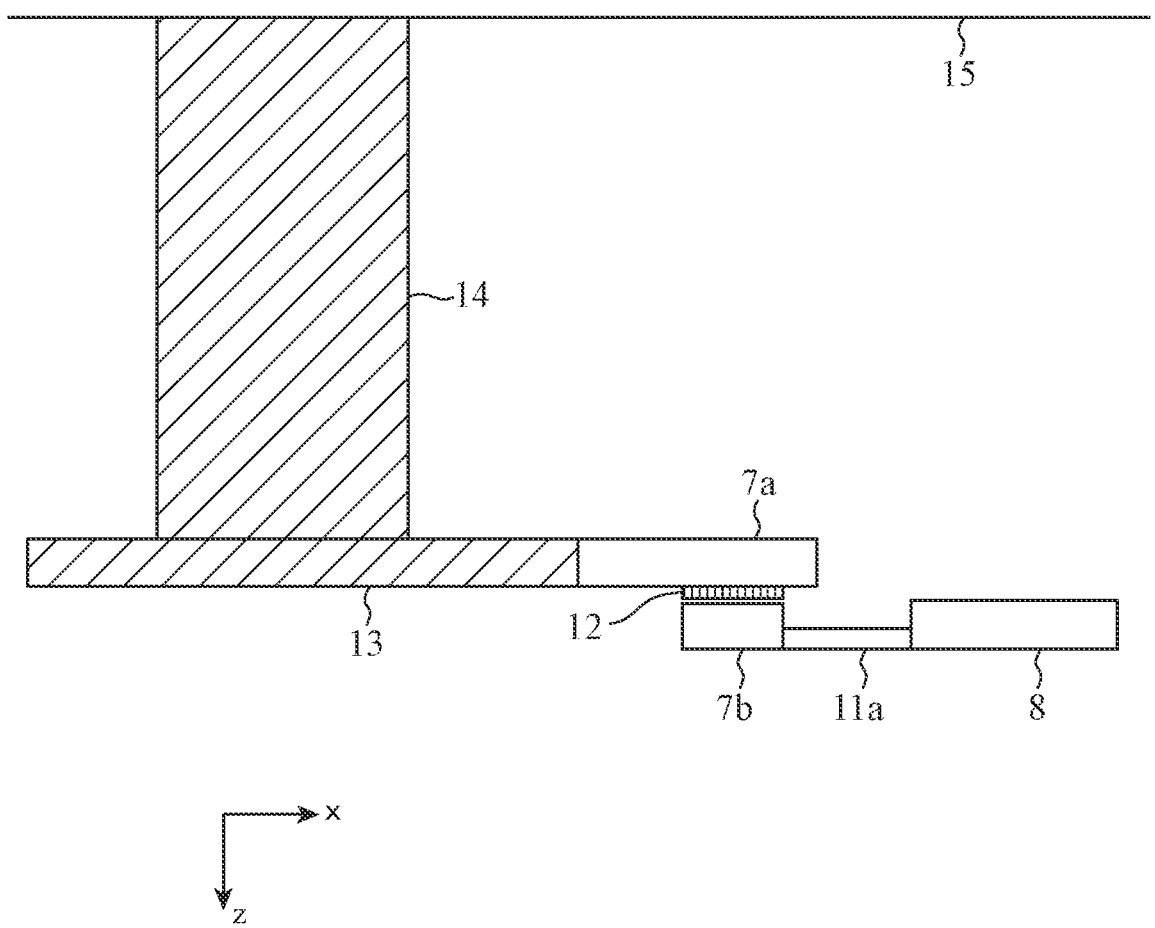
FIG. 8 is a cross-sectional view showing another MIM capacitor 7 of the high-frequency amplifier according to the first embodiment of the present invention.

FIG. 8 is a cross-sectional view showing another MIM capacitor 7 of the high-frequency amplifier according to the first embodiment of the present invention.

In an example of FIG. 8, a length of the lower electrode 7b in the x-axis direction is a quarter of the harmonic wavelength.

Further, a length of the upper electrode 7a in the x-axis direction is longer than that of the lower electrode 7b. The length of the upper electrode 7a in the x-axis direction may be the same as the length of the lower electrode 7b.

An example in which the length of the upper electrode 7a in the x-axis direction or the length of the lower electrode 7b in the x-axis direction is a quarter of the harmonic wavelength, is the first embodiment.

No limitation is intended. The length of the upper electrode 7a in the x-axis direction may be a quarter of the harmonic wavelength, and the length of the lower electrode 7b in the x-axis direction may be a quarter of a wavelength of a harmonic having a different order from the above harmonic.

For example, it can be considered that the length of the upper electrode 7a in the x-axis direction is a quarter of a wavelength of a second-order harmonic, and the length of the lower electrode 7b in the x-axis direction is a quarter of a wavelength of a third-order or fourth-order harmonic.

Further, it can be considered that the length of the lower electrode 7b in the x-axis direction is a quarter of the wavelength of the second-order harmonic, and the length of the upper electrode 7a in the x-axis direction is a quarter of the wavelength of the third-order or fourth-order harmonic.

In the first embodiment, an example in which the MIM capacitor 7 is included in the second matching circuit 5 and an example in which the MIM capacitor 7 is included in the first matching circuit 4 are shown. However, as shown in FIG. 9, the MIM capacitor 7 may be included in the second matching circuit 5, and the MIM capacitor 7 may be included in the first matching circuit 4.

Figure 9:
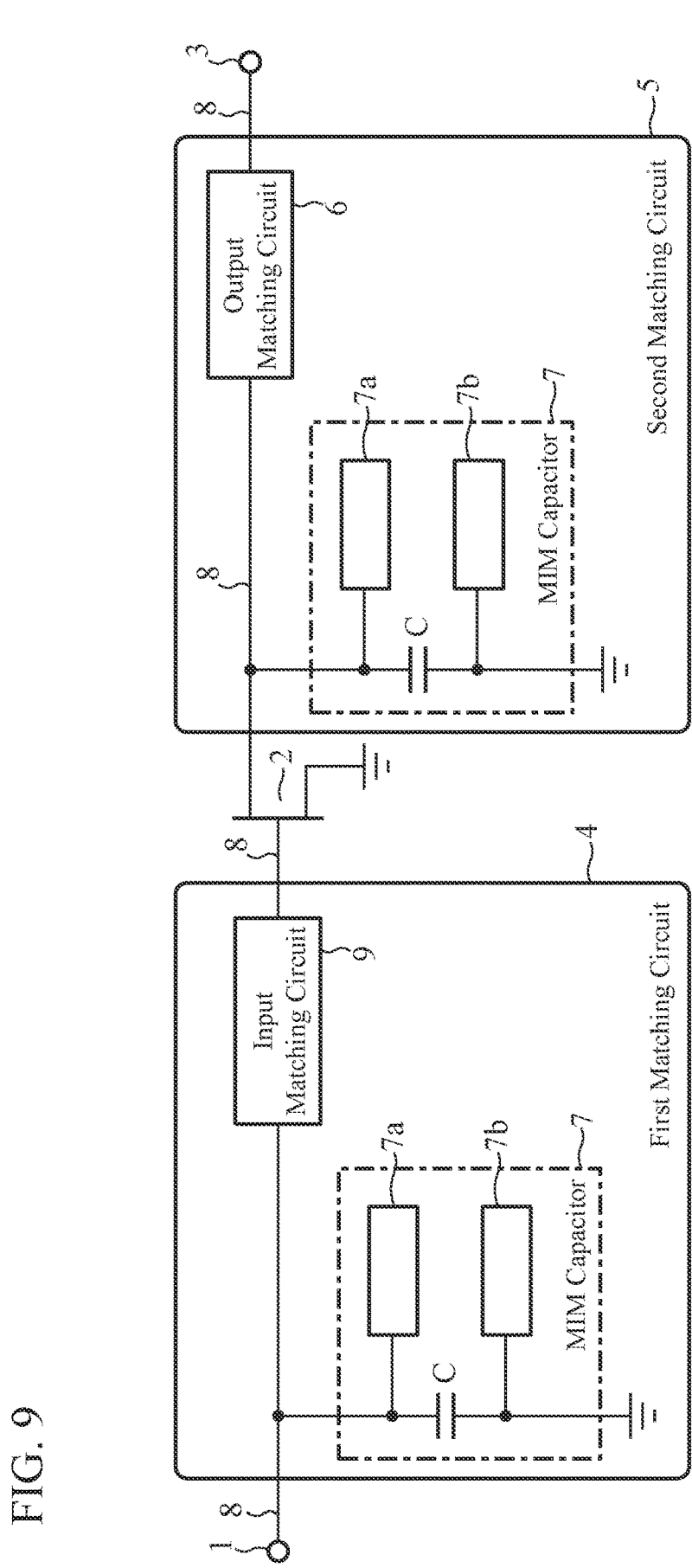
FIG. 9 is a configuration diagram showing another high-frequency amplifier according to the first embodiment of the present invention.

FIG. 9 is a configuration diagram showing another high-frequency amplifier according to the first embodiment of the present invention.

Second Embodiment

In the first embodiment, an example in which the MIM capacitor 7 includes the upper electrode 7a and the lower electrode 7b is shown.

In a second embodiment, an example in which the MIM capacitor 7 further includes a conductor 30 will be described.

Figure 10:
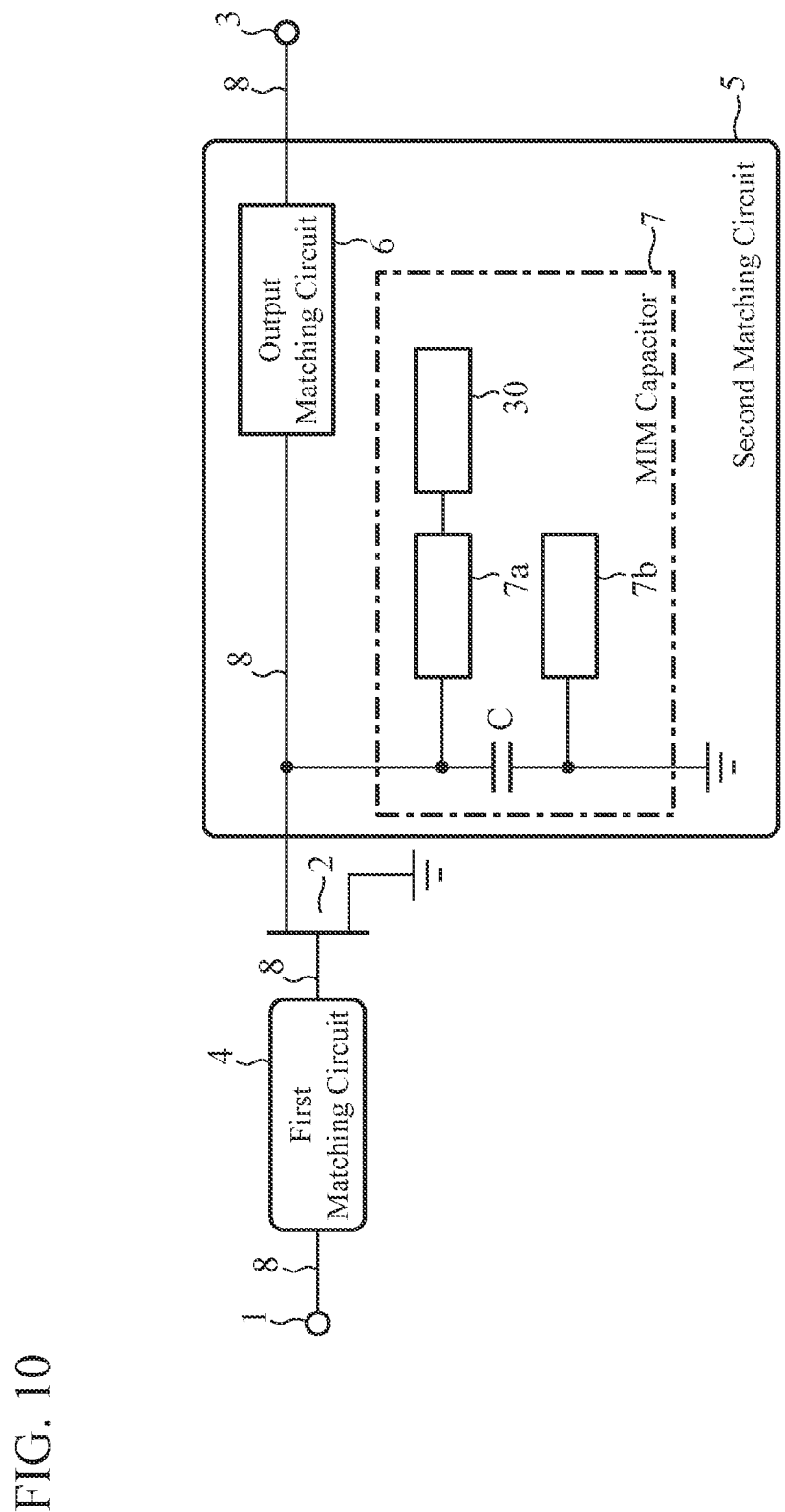
FIG. 10 is a configuration diagram showing a high-frequency amplifier according to a second embodiment of the present invention.

FIG. 10 is a configuration diagram showing a high-frequency amplifier according to the second embodiment of the present invention.

Figure 11:
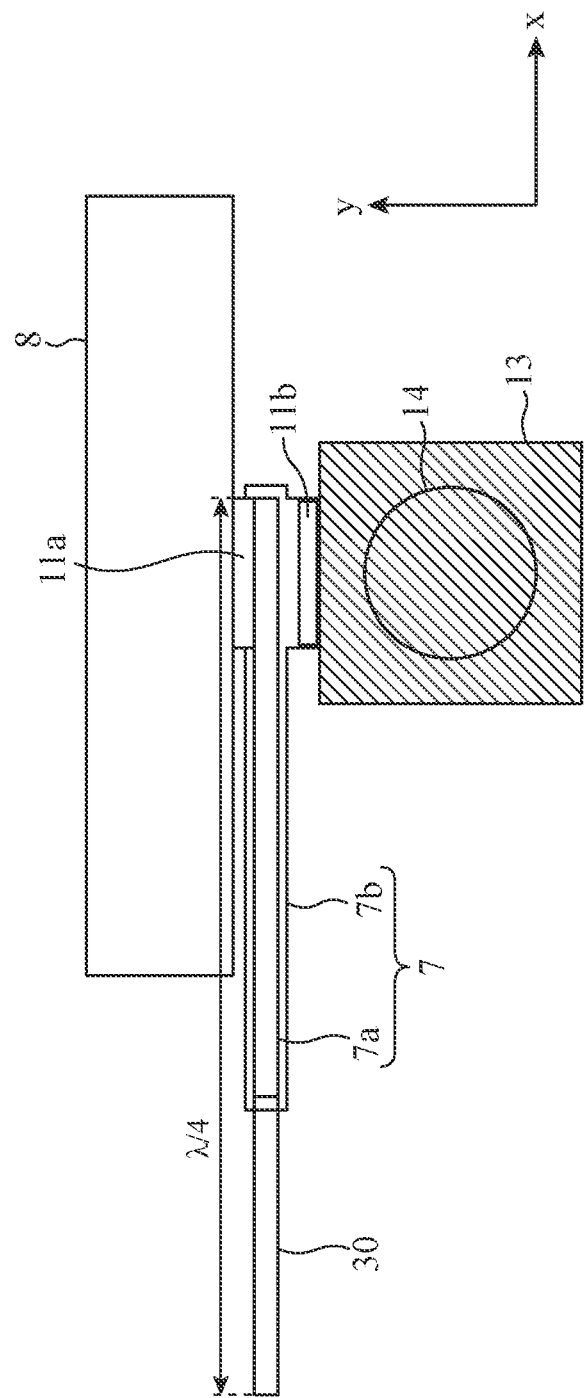
FIG. 11 is a configuration diagram showing a MIM capacitor 7 of the amplifier according to the second embodiment of the present invention.

FIG. 11 is a configuration diagram showing the MIM capacitor 7 of the amplifier according to the second embodiment of the present invention.

In FIGS. 10 and 11, since the same reference numerals as those in FIGS. 1 and 3 indicate the same or corresponding portions, description thereof will be omitted.

The conductor 30 is an electrode having one end connected to another end of an upper electrode 7a.

In the second embodiment, a combined length of the upper electrode 7a and the conductor 30 is a quarter of a wavelength of the harmonic included in the high-frequency signal.

Since a total area of the upper electrode 7a is determined by the capacitance value "C" of the MIM capacitor 7 necessary for impedance matching of the fundamental wave, a length of the upper electrode 7a in the x-axis direction necessary for harmonic processing may not be secured.

In other words, when a length of the upper electrode 7a in the x-axis direction necessary for harmonic processing is secured, the capacitance value "C" of the MIM capacitor 7 becomes too large, and impedance matching of the fundamental wave may not be achieved.

In the second embodiment, in order to prevent the capacitance value "C" of the MIM capacitor 7 from becoming too large, instead of suppressing the length of the upper electrode 7a in the x-axis direction, the conductor 30 is connected to the other end of the upper electrode 7a, so that the combined length of the upper electrode 7a and the conductor 30 matches a length of a quarter of the harmonic wavelength.

At this time, as shown in FIG. 11, when the conductor 30 is viewed from a z-axis direction, an overlap with a lower electrode 7b is small, so that even when the conductor 30 is connected, the capacitance value "C" of the MIM capacitor 7 rarely changes.

Therefore, it is possible to ensure an electrical length of an open stub necessary for harmonic processing without affecting impedance matching of the fundamental wave.

In the second embodiment, an example in which a shape of the conductor 30 is a rectangle that is long in the x-axis direction is shown, but a length of the conductor 30 may be any length if the combined length of the upper electrode 7a and the conductor 30 is a quarter of the harmonic wavelength, and a longitudinal direction of the conductor 30 may be any direction.

As is apparent from the above, according to the second embodiment, the MIM capacitor 7 includes the upper electrode 7a having one end connected to the transmission line 8, the lower electrode 7b wounded via a source via 14 and facing the upper electrode 7a, and the conductor 30 having one end connected to the other end of the upper electrode 7a. Since the combined length of the upper electrode 7a and the conductor 30 is configured to be a quarter of the wavelength of the harmonic, in addition to the same effect as in the first embodiment, even when the capacitance value "C" of the MIM capacitor 7 necessary for impedance matching of the fundamental wave is small, the electrical length of the open stub necessary for harmonic processing can be ensured.

In the second embodiment, an example in which the combined length of the upper electrode 7a and the conductor 30 in the x-axis direction is a quarter of the wavelength of the harmonic is shown.

No limitation is intended. The combined length of the upper electrode 7a and the conductor 30 in the x-axis direction may be a quarter of the wavelength of the harmonic, and a length in the x-axis direction of the lower electrode 7b may be a quarter of a wavelength of a harmonic having a different order from the above harmonic.

For example, it is conceivable that the combined length of the upper electrode 7a and the conductor 30 in the x-axis direction is a quarter of a wavelength of a second-order harmonic, and the length of the lower electrode 7b in the x-axis direction is a quarter of a wavelength of a third-order or fourth-order harmonic.

Further, it is conceivable that the length of the lower electrode 7b in the x-axis direction is a quarter of the wavelength of the second-order harmonic, and the combined length of the upper electrode 7a and the conductor 30 in the x-axis direction is a quarter of the wavelength of the third-order or fourth-order harmonic.

In the second embodiment, an example in which the MIM capacitor 7 having the conductor 30 is included in the second matching circuit 5 is shown, but No limitation is intended.

Figure 12:
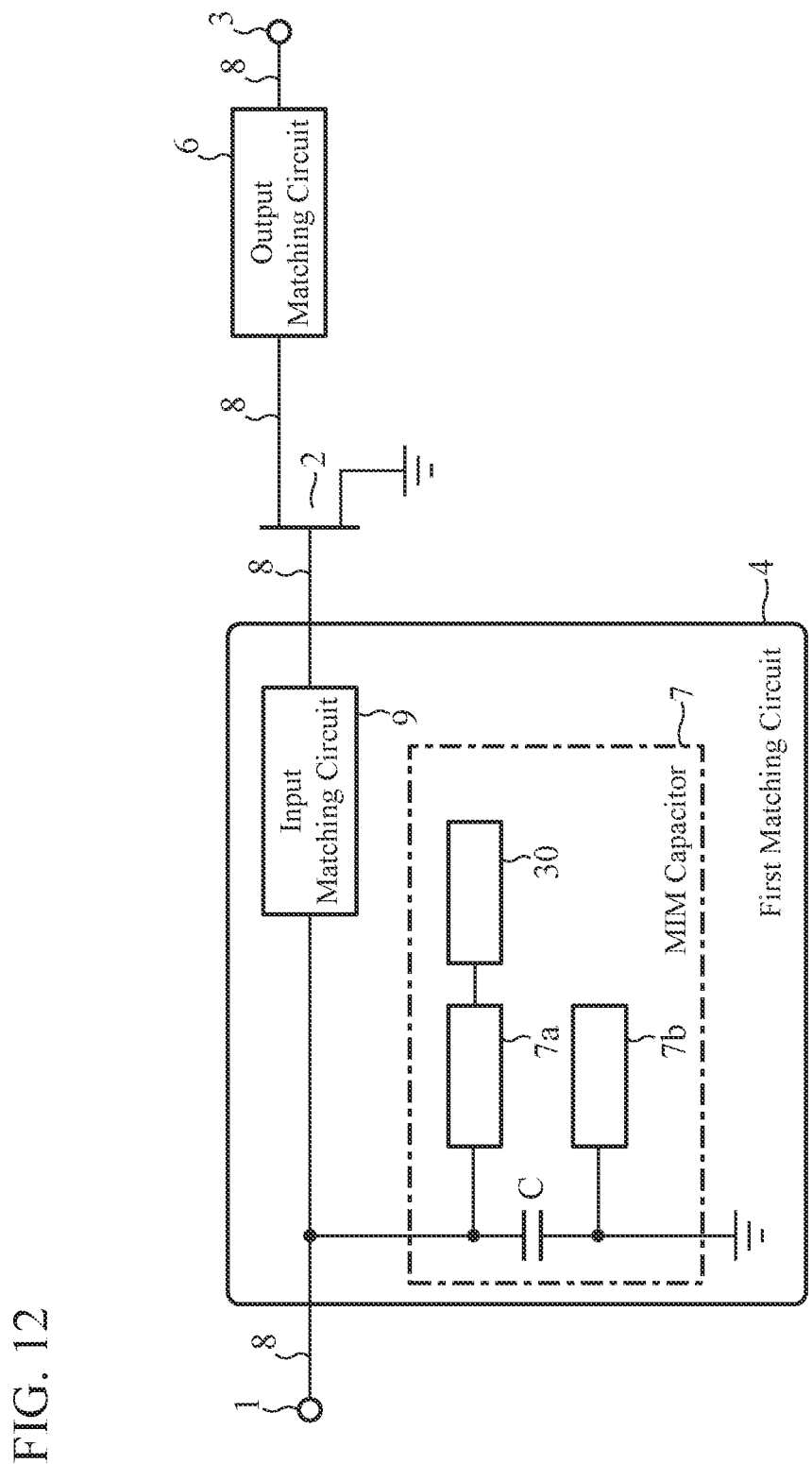
FIG. 12 is a configuration diagram showing another high-frequency amplifier according to the second embodiment of the present invention.

For example, as shown in FIG. 12, the MIM capacitor 7 having the conductor 30 may be included in a first matching circuit 4.

FIG. 12 is a configuration diagram showing another high-frequency amplifier according to the second embodiment of the present invention.

In the second embodiment, an example in which the MIM capacitor 7 is included in the second matching circuit 5 and an example in which the MIM capacitor 7 is included in the first matching circuit 4 are shown. However, as shown in FIG. 13, the MIM capacitor 7 may be included in the second matching circuit 5, and the MIM capacitor 7 may be included in the first matching circuit 4.

Figure 13:
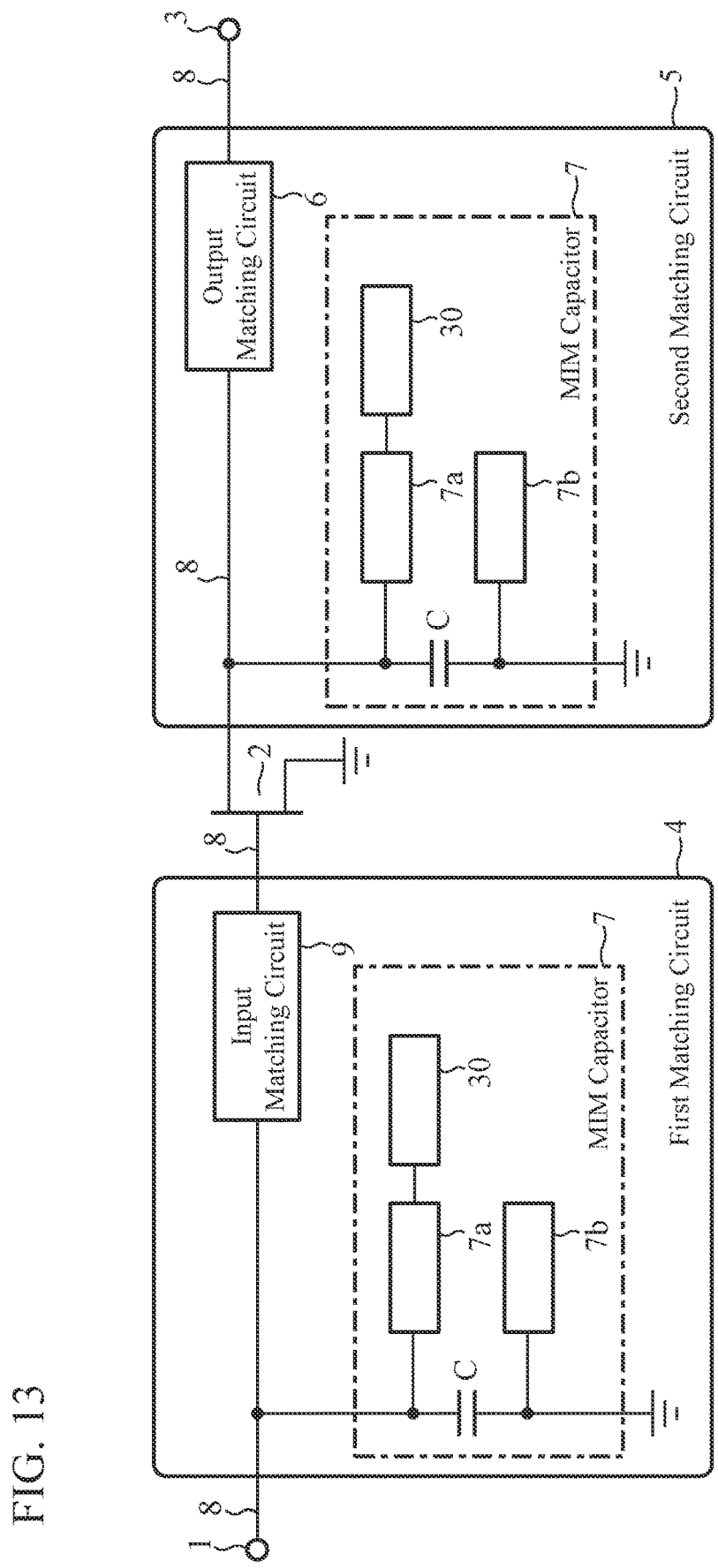
FIG. 13 is a configuration diagram showing another high-frequency amplifier according to the second embodiment of the present invention.

FIG. 13 is a configuration diagram showing another high-frequency amplifier according to the second embodiment of the present invention.

An example in which the upper electrode 7a connected to the conductor 30 is connected to the transmission line 8 through the air bridge 11a and the lower electrode 7b is connected to the ground 15 through the air bridge 11b, the conductor plate 13, and the source via 14, is shown in the second embodiment.

No limitation is intended. For example, as shown in FIG. 14, a lower electrode 7b connected to a conductor 30 may be connected to the transmission line 8 through an air bridge 11a, and an upper electrode 7a may be connected to a ground 15 through an air bridge 11b, a conductor plate 13, and a source via 14.

Figure 14:
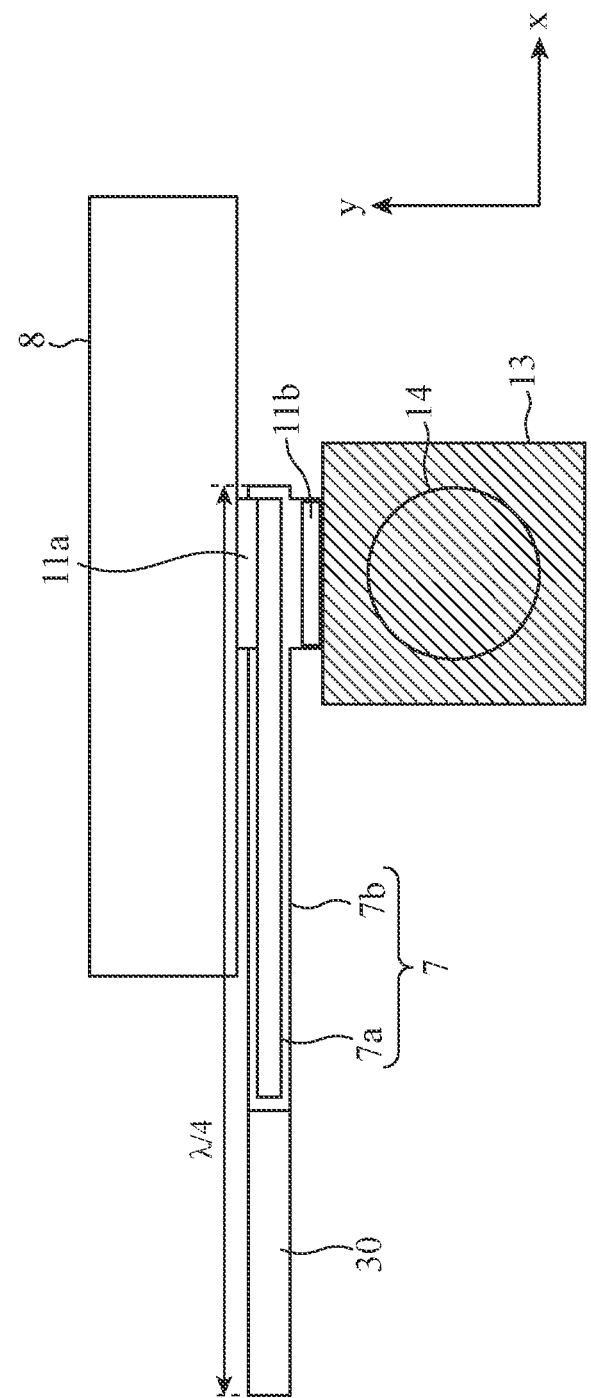
FIG. 14 is a configuration diagram showing another MIM capacitor 7 of the high-frequency amplifier according to the second embodiment of the present invention.

FIG. 14 is a configuration diagram showing another MIM capacitor 7 of the high-frequency amplifier according to the second embodiment of the present invention.

In the example of FIG. 14, a combined length of the lower electrode 7b and the conductor 30 in the x-axis direction is a quarter of a harmonic wavelength.

An example in which the combined length of the lower electrode 7b and the conductor 30 in the x-axis direction is a quarter of the harmonic wavelength, is shown in this case.

No limitation is intended. The combined length of the lower electrode 7b and the conductor 30 in the x-axis direction may be a quarter of the harmonic wavelength, and a length in the x-axis direction of the upper electrode 7a may be a quarter of a wavelength of a harmonic having a different order from the above harmonic.

For example, it is conceivable that the combined length of the lower electrode 7b and the conductor 30 in the x-axis direction is a quarter of a wavelength of a second-order harmonic, and the length of the upper electrode 7a in the x-axis direction is a quarter of a wavelength of a third-order or fourth-order harmonic.

Further, it is conceivable that the length of the upper electrode 7a in the x-axis direction is a quarter of the wavelength of the second-order harmonic, and the combined length of the lower electrode 7b and the conductor 30 in the x-axis direction is a quarter of the wavelength of the third-order or fourth-order harmonic.

In the first and second embodiments, an example in which the lower electrode 7b is connected to the ground 15 through the air bridge 11b, the conductor plate 13, and the source via 14 is shown.

For this reason, potential at a connection point between the lower electrode 7b and the conductor plate 13 is approximately ground potential, but may not be complete ground potential. In this case, the upper electrode 7a and the lower electrode 7b can be regarded as independent open stubs.

Hereinafter, a point at which a frequency constituting a short-circuit point changes will be described.

Here, for convenience of explanation, it is assumed that a substrate corresponding to a length of the source via 14 is a GaAs substrate having a thickness of 100 μm, a thickness of the dielectric layer 12 is 1 μm, and a relative dielectric constant of the dielectric layer 12 is 6.

Figure 15:
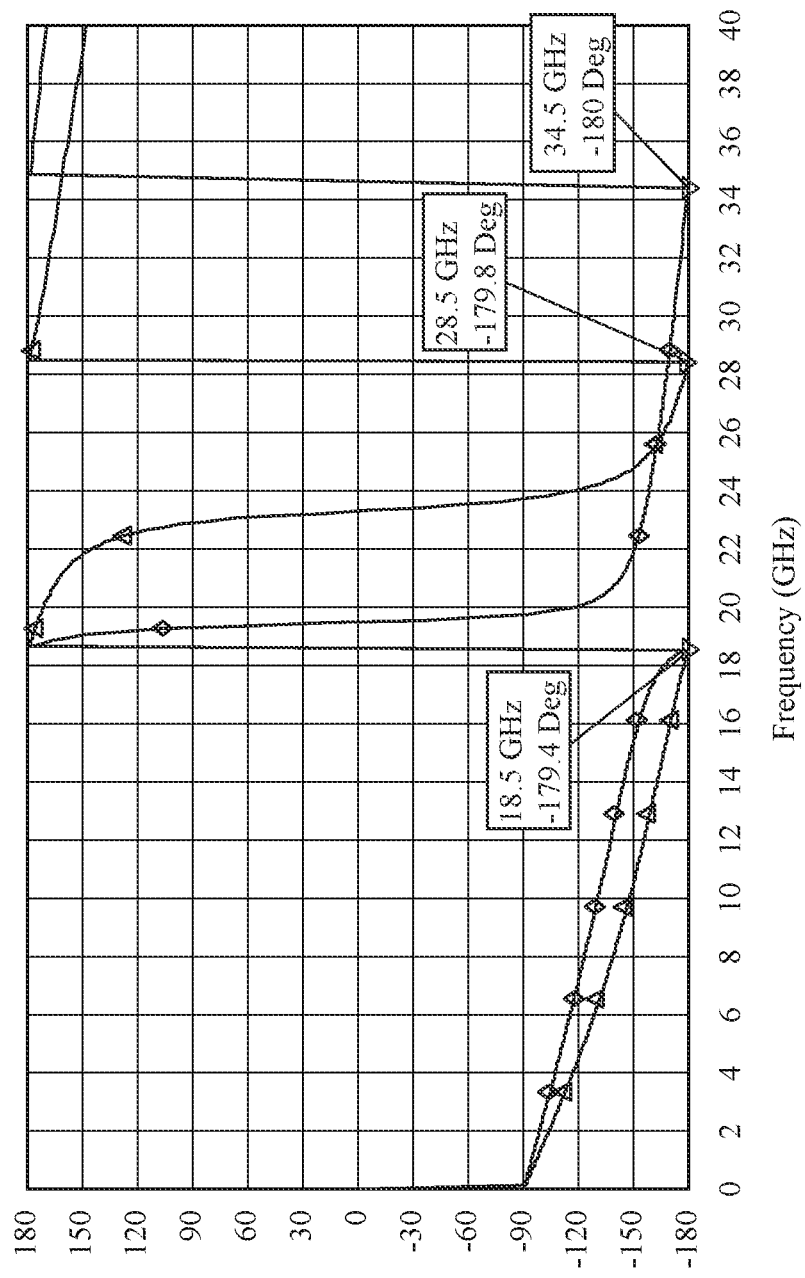
FIG. 15 is an explanatory diagram showing calculation results of frequency characteristics of reflection phases viewed from a main line.

FIG. 15 is an explanatory diagram showing calculation results of frequency characteristics of reflection phases viewed from the main line.

FIG. 15 shows a calculation result when physical lengths of the upper electrode 7a and the lower electrode 7b are each set so that an electrical length of the upper electrode 7a is a quarter wavelength at a frequency of 18.5 GHz and an electrical length of the lower electrode 7b is a quarter wavelength at a frequency of 28.5 GHz.

In addition, FIG. 15 shows a calculation result when the physical lengths of the upper electrode 7a and the lower electrode 7b are each set so that the electrical length of the upper electrode 7a is a quarter wavelength at a frequency of 18.5 GHz and the electrical length of the lower electrode 7b is a quarter wavelength at a frequency of 34.5 GHz.

As can be seen from FIG. 15, when the physical length of the upper electrode 7a and the physical length of the lower electrode 7b change, the frequency constituting the short-circuit point changes.

It is known that operating efficiency of a single transistor 2 used in a high-frequency amplifier decreases as a frequency of a high-frequency signal increases.

Therefore, efficiency of the high-frequency amplifier including the transistor 2 also decreases as the frequency of the high-frequency signal increases.

The decrease in the efficiency of the high-frequency amplifier leads to an increase in size of a power supply device connected to the high-frequency amplifier since power consumption increases.

Therefore, in the first and second embodiments, when a high-frequency signal in a frequency band in which the operating efficiency of the transistor 2 particularly decreases is input, it is desirable that the MIM capacitor 7 be included in at least one of the second matching circuit 5 and the first matching circuit 4.

In the high-frequency amplifiers of the first and second embodiments, for example, it is assumed that a frequency that is half an operating frequency to an upper limit frequency of the operating frequency is applied.

An operating frequency band in the transistor 2 is a frequency band that does not include a harmonic frequency in which a short-circuit point is formed by the MIM capacitor 7.

From the above, efficiency on a high-frequency side of the operating frequency can be improved, and efficiency of the amplifier can be made high and flat over a wide band.

It is to be noted that the present invention can freely combine embodiments, modify arbitrary components in the embodiments, or omit arbitrary components in the embodiments within the scope of the invention.

INDUSTRIAL APPLICABILITY

The present invention is suitable for an amplifier that amplifies a high-frequency signal.

REFERENCE SIGNS LIST

1: Input terminal,
2: Transistor,
3: Output terminal,
4: First matching circuit,
5: Second matching circuit,
6: Output matching circuit,
7: MIM capacitor,
7a: Upper electrode,
7b: Lower electrode, 8: Transmission line,
9: Input matching circuit,
11a and 11b: Air bridge,
12: Dielectric layer,
13: Conductor plate,
14: Source via,
15: Ground, and
30: Conductor.

The invention claimed is:

1. A high-frequency amplifier comprising:
a transistor to amplify a high-frequency signal;
a first matching circuit connected to an input side of the transistor;
a second matching circuit connected to an output side of the transistor; and
a metal insulator metal (MIM) capacitor having one end connected to a transmission line for the high-frequency signal extending from an input side of the first matching circuit to an output side of the second matching circuit, the MIM capacitor having another end grounded,
wherein the MIM capacitor is included in any one or more of the first matching circuit and the second matching circuit,
wherein the MIM capacitor achieves impedance matching of a fundamental wave included in the high frequency signal with the transmission line, and forms a short-circuit point for a harmonic included in the high frequency signal at a connection point with the transmission line, and wherein the MIM capacitor includes a capacitor connected between a first open stub and a second open stub.

2. The high-frequency amplifier according to claim 1, wherein
the MIM capacitor includes:
an upper electrode having one end connected to the transmission line, and
a lower electrode grounded through a source via and facing the upper electrode, and
a length of the upper electrode is a quarter of a wavelength of the harmonic.

3. The high-frequency amplifier according to claim 2, wherein a length of the lower electrode is a quarter of a wavelength of a harmonic having a different order from the harmonic.

4. The high-frequency amplifier according to claim 1, wherein
the MIM capacitor includes:
a lower electrode having one end connected to the transmission line, and
an upper electrode grounded through a source via and facing the lower electrode, and
a length of the lower electrode is a quarter of a wavelength of the harmonic.

5. The high-frequency amplifier according to claim 4, wherein
a length of the upper electrode is a quarter of a wavelength of a harmonic having a different order from the harmonic.

6. The high-frequency amplifier according to claim 1, wherein
the MIM capacitor includes:
an upper electrode having one end connected to the transmission line,
a lower electrode grounded through a source via and facing the upper electrode, and
a conductor having one end connected to another end of the upper electrode, and
a combined length of the upper electrode and the conductor is a quarter of a wavelength of the harmonic.

7. The high-frequency amplifier according to claim 6, wherein
a length of the lower electrode is a quarter of a wavelength of a harmonic having a different order from the harmonic.

8. The high-frequency amplifier according to claim 1, wherein
the MIM capacitor includes:
a lower electrode having one end connected to the transmission line,
an upper electrode grounded through a source via and facing the lower electrode, and
a conductor having one end connected to another end of the lower electrode, and
a combined length of the lower electrode and the conductor is a quarter of a wavelength of the harmonic.

9. The high-frequency amplifier according to claim 8, wherein
a length of the upper electrode is a quarter of a wavelength of a harmonic having a different order from the harmonic.

10. The high-frequency amplifier according to claim 1, wherein
an operating frequency band in the transistor is a frequency band that does not include a harmonic frequency in which the short-circuit point is formed.

11. The high-frequency amplifier according to claim 2, wherein
an operating frequency band in the transistor is a frequency band that does not include a harmonic frequency in which the short-circuit point is formed.

12. The high-frequency amplifier according to claim 3, wherein
an operating frequency band in the transistor is a frequency band that does not include a harmonic frequency in which the short-circuit point is formed.

13. The high-frequency amplifier according to claim 4, wherein
an operating frequency band in the transistor is a frequency band that does not include a harmonic frequency in which the short-circuit point is formed.

14. The high-frequency amplifier according to claim 5, wherein
an operating frequency band in the transistor is a frequency band that does not include a harmonic frequency in which the short-circuit point is formed.

15. The high-frequency amplifier according to claim 6, wherein
an operating frequency band in the transistor is a frequency band that does not include a harmonic frequency in which the short-circuit point is formed.

16. The high-frequency amplifier according to claim 7, wherein
an operating frequency band in the transistor is a frequency band that does not include a harmonic frequency in which the short-circuit point is formed.

17. The high-frequency amplifier according to claim 8, wherein
an operating frequency band in the transistor is a frequency band that does not include a harmonic frequency in which the short-circuit point is formed.

18. The high-frequency amplifier according to claim 9, wherein an operating frequency band in the transistor is a frequency band that does not include a harmonic frequency in which the short-circuit point is formed.

* * * * *